United States Patent
Yang

(10) Patent No.: US 12,495,577 B2
(45) Date of Patent: Dec. 9, 2025

(54) SELF-ALIGNED SILICIDE GATE FOR DISCRETE SHIELDED-GATE TRENCH POWER MOSFET

(71) Applicant: Analog Devices, Inc., Wilmington, MA (US)

(72) Inventor: Zhenyin Yang, San Jose, CA (US)

(73) Assignee: Analog Devices, Inc., Wilmington, MA (US)

( * ) Notice: Subject to any disclaimer, the term of this patent is extended or adjusted under 35 U.S.C. 154(b) by 475 days.

(21) Appl. No.: 17/890,209

(22) Filed: Aug. 17, 2022

(65) Prior Publication Data

US 2024/0063305 A1   Feb. 22, 2024

(51) Int. Cl.
| | | |
|---|---|---|
| H10D 30/66 | (2025.01) | |
| H01L 21/285 | (2006.01) | |
| H02M 3/158 | (2006.01) | |
| H10D 30/01 | (2025.01) | |
| H10D 64/27 | (2025.01) | |

(52) U.S. Cl.
CPC ..... *H10D 30/668* (2025.01); *H01L 21/28518* (2013.01); *H02M 3/158* (2013.01); *H10D 30/0297* (2025.01); *H10D 64/513* (2025.01)

(58) Field of Classification Search
CPC ............. H10D 30/668; H10D 30/0297; H10D 64/513; H10D 64/117
See application file for complete search history.

(56) References Cited

U.S. PATENT DOCUMENTS

| | | | |
|---|---|---|---|
| 4,967,245 A | 10/1990 | Cogan et al. | |
| 5,661,322 A | 8/1997 | Williams et al. | |
| 5,877,538 A | 3/1999 | Williams | |
| 5,998,834 A | 12/1999 | Williams et al. | |
| 5,998,836 A | 12/1999 | Williams | |
| 5,998,837 A | 12/1999 | Williams | |
| 6,096,608 A | 8/2000 | Williams | |
| 6,140,678 A | 10/2000 | Grabowski et al. | |
| 6,204,533 B1 | 3/2001 | Williams et al. | |
| 6,348,712 B1 | 2/2002 | Korec et al. | |
| 6,396,102 B1 | 5/2002 | Calafut | |
| 6,534,366 B2 | 3/2003 | Korec et al. | |
| 6,576,516 B1 | 6/2003 | Blanchard | |
| 6,656,797 B2 | 12/2003 | Blanchard | |
| 6,673,680 B2 | 1/2004 | Calafut | |
| 6,710,403 B2 | 3/2004 | Sapp | |

(Continued)

OTHER PUBLICATIONS

Extended European Search Report for Application No. 23188246.5 dated Jan. 19, 2024 in 10 pages.

*Primary Examiner* — Wasiul Haider

(74) *Attorney, Agent, or Firm* — Knobbe, Martens, Olson & Bear, LLP

(57) ABSTRACT

Apparatus and methods for shielded-gate trench power MOSFETs are disclosed herein. The power MOSFETs are fabricated using a self-aligned gate poly silicide to achieve low gate resistance. Accordingly, the power MOSFETs can be used in high speed applications operating with fast transistor switching speeds. Moreover, the self-aligned gate poly silicide processing can be achieved in relatively few processing steps, and thus can avoid the cost and/or complexity associated with conventional silicidation techniques for trench power MOSFETs. In particular, silicidation can include applying a silicide that is self-aligned to a gate oxide without an additional mask.

20 Claims, 9 Drawing Sheets

(56) References Cited

U.S. PATENT DOCUMENTS

| | | |
|---|---|---|
| 6,750,104 B2 | 6/2004 | Blanchard et al. |
| 6,777,295 B1 | 8/2004 | Lin et al. |
| 6,800,509 B1 | 10/2004 | Lin et al. |
| 6,861,701 B2 | 3/2005 | Williams et al. |
| 6,878,992 B2 | 4/2005 | Kawaguchi et al. |
| 6,884,684 B2 | 4/2005 | Huang et al. |
| 7,012,301 B2 | 3/2006 | Tabuchi et al. |
| 7,019,360 B2 | 3/2006 | Blanchard et al. |
| 7,033,892 B2 | 4/2006 | Hsu et al. |
| 7,060,567 B1 | 6/2006 | Hsu |
| 7,063,975 B2 | 6/2006 | Tsukanov et al. |
| 7,084,033 B2 | 8/2006 | Hsu |
| 7,091,552 B2 | 8/2006 | Blanchard |
| 7,196,376 B2 | 3/2007 | Kurosaki et al. |
| 7,224,027 B2 | 5/2007 | Blanchard |
| 7,256,086 B2 | 8/2007 | Tabuchi et al. |
| 7,368,353 B2 | 5/2008 | Cao et al. |
| 7,390,717 B2 | 6/2008 | Cao et al. |
| 7,595,242 B2 | 9/2009 | Nakazawa et al. |
| 7,701,001 B2 | 4/2010 | Jianjun et al. |
| 8,159,024 B2 | 4/2012 | Chow et al. |
| 8,304,828 B2 | 11/2012 | Hsu |
| 8,362,550 B2 | 1/2013 | Rexer et al. |
| 8,421,149 B2 | 4/2013 | Chang et al. |
| 8,569,134 B2 | 10/2013 | Hsu |
| 8,647,948 B2 | 2/2014 | Eguchi et al. |
| 8,796,094 B2 | 8/2014 | Eguchi et al. |
| 8,872,265 B2 | 10/2014 | Yeh et al. |
| 8,872,266 B1 | 10/2014 | Hsu et al. |
| 8,896,060 B2 | 11/2014 | Ng et al. |
| 8,900,950 B2 | 12/2014 | Hsu |
| 8,921,927 B2 | 12/2014 | Eguchi et al. |
| 8,933,507 B2 | 1/2015 | Ng et al. |
| 8,962,425 B2 | 2/2015 | Shen et al. |
| 9,035,378 B2 | 5/2015 | Hsu et al. |
| 9,099,519 B2 | 8/2015 | Shen et al. |
| 9,105,494 B2 | 8/2015 | Lee et al. |
| 9,130,035 B2 | 9/2015 | Hsu |
| 9,171,931 B2 | 10/2015 | Ng et al. |
| 9,190,478 B2 | 11/2015 | Calafut et al. |
| 9,281,368 B1 | 3/2016 | Lee et al. |
| 9,349,857 B2 | 5/2016 | Hsu |
| 9,412,844 B2 | 8/2016 | Ng et al. |
| 9,425,306 B2 | 8/2016 | Gao et al. |
| 9,443,974 B2 | 9/2016 | Gao et al. |
| 9,536,972 B2 | 1/2017 | Hsu |
| 9,673,289 B2 | 6/2017 | Calafut et al. |
| 9,691,863 B2 | 6/2017 | Xue et al. |
| 9,741,808 B2 | 8/2017 | Lee et al. |
| 9,837,508 B2 | 12/2017 | Hsu |
| 9,865,694 B2 | 1/2018 | Lee et al. |
| 10,103,257 B1 | 10/2018 | Qin et al. |
| 10,109,732 B2 | 10/2018 | Ng et al. |
| 10,304,933 B1 | 5/2019 | Woo et al. |
| 10,431,678 B2 | 10/2019 | Qin et al. |
| 10,510,880 B2 | 12/2019 | Ng et al. |
| 10,529,567 B2 | 1/2020 | Yan |
| 10,644,118 B2 | 5/2020 | Xue et al. |
| 10,861,965 B2 | 12/2020 | Deng |
| 11,004,839 B1 | 5/2021 | Deng et al. |
| 11,329,150 B2 | 5/2022 | Saxena et al. |
| 2003/0203552 A1 | 10/2003 | Blanchard |
| 2004/0145011 A1 | 7/2004 | Hsu et al. |
| 2005/0040459 A1 | 2/2005 | Amato et al. |
| 2005/0199918 A1 | 9/2005 | Calafut et al. |
| 2006/0214221 A1 | 9/2006 | Challa et al. |
| 2007/0032029 A1 | 2/2007 | Chow et al. |
| 2009/0061584 A1 | 3/2009 | Lin et al. |
| 2009/0250750 A1 | 10/2009 | Takemori et al. |
| 2010/0123188 A1 | 5/2010 | Venkatraman |
| 2010/0244126 A1* | 9/2010 | Purtell ............... H10D 30/0297 438/270 |
| 2011/0140183 A1* | 6/2011 | Nagai .................. H10D 84/013 257/296 |
| 2015/0171201 A1 | 6/2015 | Lui et al. |
| 2018/0323299 A1* | 11/2018 | Tominaga ............ H10D 30/662 |
| 2019/0035928 A1 | 1/2019 | Minamisawa et al. |
| 2019/0363166 A1 | 11/2019 | Knoll et al. |
| 2021/0043735 A1 | 2/2021 | Minamisawa et al. |
| 2022/0052194 A1 | 2/2022 | Adnan et al. |
| 2022/0231161 A1 | 7/2022 | Saxena et al. |
| 2022/0302303 A1 | 9/2022 | Shin |
| 2022/0310813 A1 | 9/2022 | Hossain et al. |
| 2022/0320303 A1 | 10/2022 | Liu et al. |
| 2022/0320332 A1 | 10/2022 | Yong et al. |
| 2022/0344505 A1 | 10/2022 | Li et al. |

\* cited by examiner

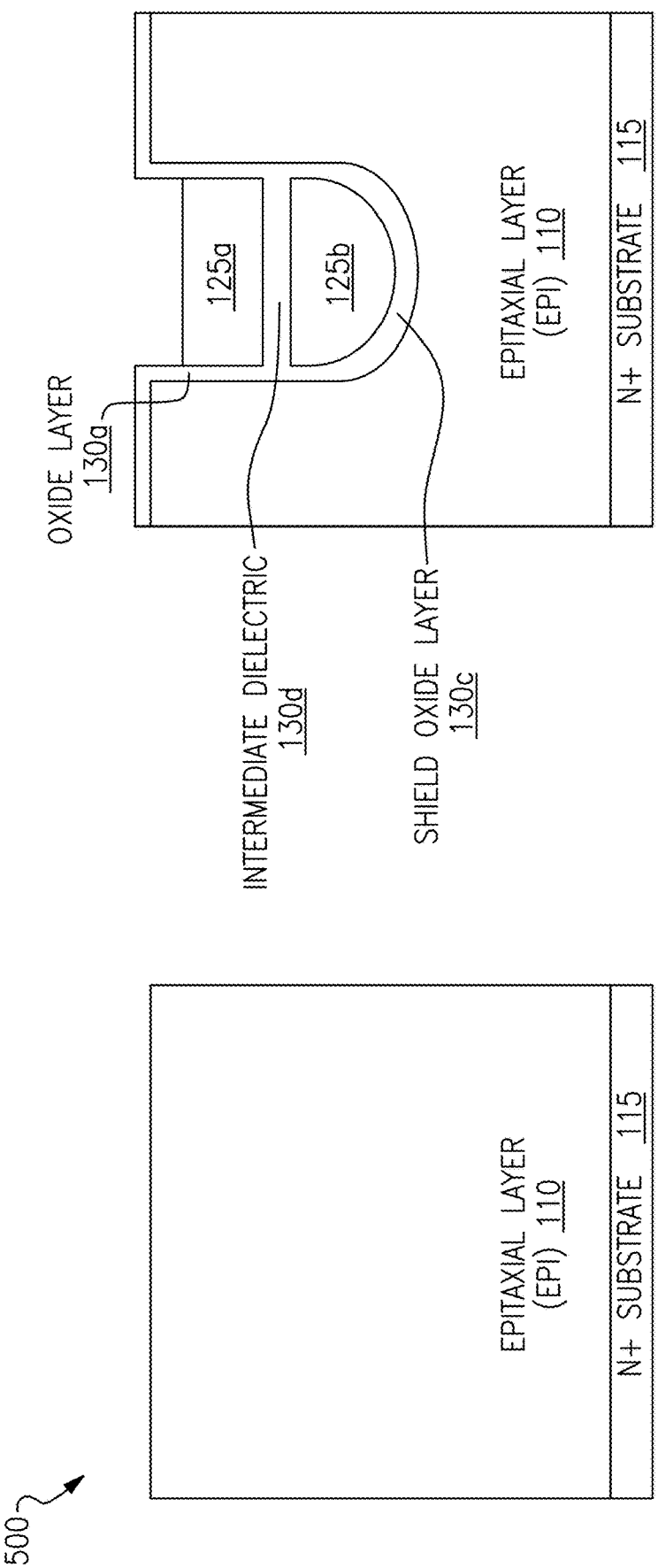

SELF-ALIGNED SILICIDE GATE FOR DISCRETE SHIELDED-GATE TRENCH POWER MOSFET

FIELD OF THE DISCLOSURE

The invention generally relates to power electronics, and more particular to shielded-gate trench power metal-oxide-semiconductor field-effect transistors (MOSFETs).

BACKGROUND

Shielded-gate trench power MOSFETs have been widely adopted in industry due to superior performance characteristics compared to their unshielded counterparts. However, a weakness of the shielded-gate trench power MOSFET is high gate resistance, rendering such transistors inappropriate for applications with rapid switching.

Manufacturing such transistors can also present a challenge, necessitating additional processes to precisely apply a shield layer over each transistor gate. Furthermore, due to small trench pitch and surface topology, a silicide mask is difficult to implement for a trench power MOSFET.

SUMMARY OF THE DISCLOSURE

In one aspect, a shielded-gate trench power metal-oxide-semiconductor field-effect transistor (MOSFET) is provide. The MOSFET includes a semiconductor layer of a first doping polarity, and a gate trench formed in a top surface of the semiconductor layer and including a gate shield and a gate region recessed below the top surface, the gate shield and the gate region being electrically insulated from the semiconductor layer by a gate oxide, wherein the gate region is formed over the gate shield in the gate trench and electrically insulated from the gate shield. The MOSFET further includes a semiconductor well formed in the semiconductor layer and of a second doping polarity opposite the first doping polarity, a source region formed in the semiconductor well and of the first doping polarity, a metal contact electrically connected to the semiconductor well and the source region, and a silicide region formed over the gate region, the silicide region being aligned to the gate region by the gate oxide.

In another aspect, a method of fabricating a shielded-gate MOSFET includes etching a gate trench in a top surface of a semiconductor layer of a first doping polarity, forming a semiconductor well in the semiconductor layer and of a second doping polarity opposite the first doping polarity, forming a source region in the semiconductor well and of the first doping polarity, contacting the semiconductor well and the source region using a metal contact, and forming in the gate trench a gate shield and a gate region each recessed below the top surface of the semiconductor layer and electrically insulated from the semiconductor layer by a gate oxide, wherein the gate region is formed over the gate shield in the gate trench and electrically insulated from the gate shield. The method further includes forming a silicide region over the gate region, the silicide region being aligned to the gate region by the gate oxide.

In another aspect, a switching regulator includes an inductor, a first shielded-gate trench power metal-oxide-semiconductor field-effect transistor (MOSFET) including one of a source or a drain connected to a first terminal of the inductor, and a driver configured to control a gate of the first shielded-gate trench power MOSFET. The first shielded-gate trench power MOSFET comprises a semiconductor layer of a first doping polarity, a gate trench formed in a top surface of the semiconductor layer and including a gate shield and a gate region recessed below the top surface and electrically insulated from the semiconductor layer by a gate oxide, a semiconductor well formed in the semiconductor layer and of a second doping polarity opposite the first doping polarity, and a first silicide region formed over the gate region, the first silicide region being aligned to the gate region by the gate oxide.

BRIEF DESCRIPTION OF THE DRAWINGS

FIG. 5A is a first cross-section in a method of fabricating a shielded-gate trench power MOSFET according to another embodiment.

FIG. 5B is a second cross-section in a method of fabricating a shielded-gate trench power MOSFET according to another embodiment.

DETAILED DESCRIPTION OF EMBODIMENTS

Figure 1A:
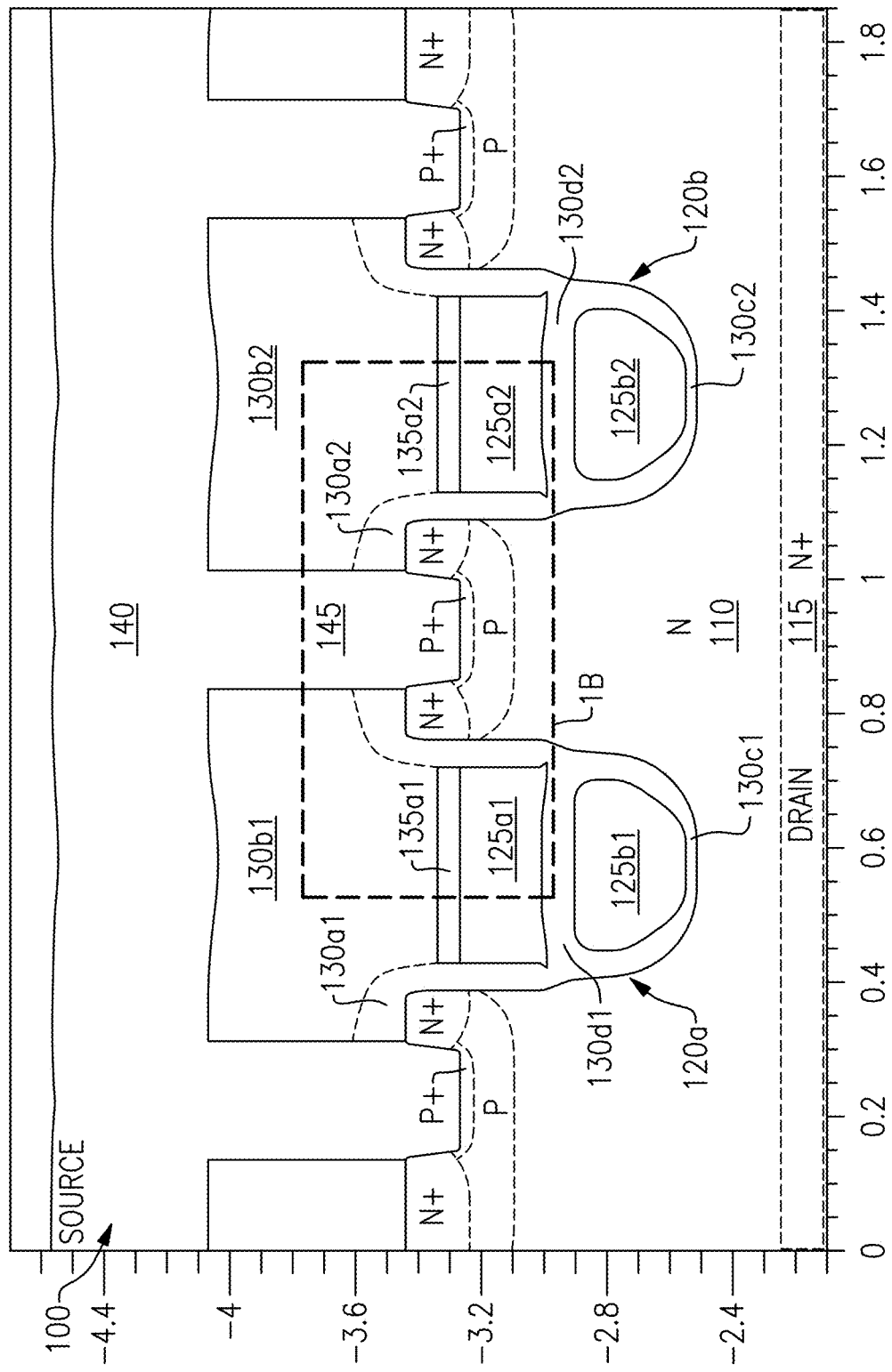
FIG. 1A is a cross-section of a shielded-gate trench power MOSFET according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for shielded-gate trench power MOSFETs are disclosed herein. The power MOSFETs are fabricated using a self-aligned gate poly silicide to achieve low gate resistance. Accordingly, the power MOSFETs can be used in high speed applications operating with fast transistor switching speeds. Moreover, the self-aligned gate poly silicide processing can be achieved without additional masking or processing steps, and thus can avoid the cost and/or complexity associated with conventional processes for shielded-gate trench power MOSFETs with silicide. In particular, the shielded-gate trench power MOSFETs herein can include silicide that is self-aligned to gate oxide without an additional mask.

The shielded-gate trench power MOSFETs can achieve high-quality poly silicide arising from combining a unique process integration with low-temperature interlayer dielectrics (ILDs).

In contrast, conventional process flows can deposit silicide prior to body/source implants, and thus in such a process flow the silicide would be heated by a high temperature for body/source diffusion. Moreover, such process flows typically use chemical vapor deposition (CVD) to form borophosphosilicate glass (BPSG) films as dielectric layers between metal layers. Since the BPSG flow is typically high temperature, conventional process flows exhibit degraded silicide quality.

Accordingly, conventional silicide processes suffer from degradations arising from any dopant diffusion and activation anneals or BPSG reflow that are subsequent to depositing the silicide. Examples of degradations include voids inside a trench poly (for example, when using tungsten silicide or WSix), narrow linewidth issues (for example, when using titanium disilicide or $TiSi_2$), and/or high temperature stability issues (for example, degraded silicide resistance due to agglomeration arising from a rapid thermal anneal (RTA), for instance, at temperatures of 850° or more when using cobalt disilicide or $CoSi_2$).

In contrast, the shielded-gate trench power MOSFETs herein can address such issues by avoiding high temperature processing after depositing silicide.

By implementing the shielded-gate trench power MOSFETs in this manner, power MOSFETs with low gate resistivity are realized. This in turn allows the power MOSFETs to be used high-frequency applications, such as a trilithic switching voltage regulator. In such applications, a top power MOSFET and/or a bottom power MOSFET (which can be connected in a half bridge circuit topology) can be implemented with a silicide-gate in accordance with the teachings herein. This enables a low resistor-capacitor (RC) delay, and thus fast gate drive to achieve low (for instance, zero) dead time while regulating. As a result, reverse recovery related power loss and switching frequency can be improved to achieve higher efficiency and smaller form factor.

Examples of such trilithic switching voltage regulators include buck converters, boost converters, and buck-boost converters.

Figure 1B:
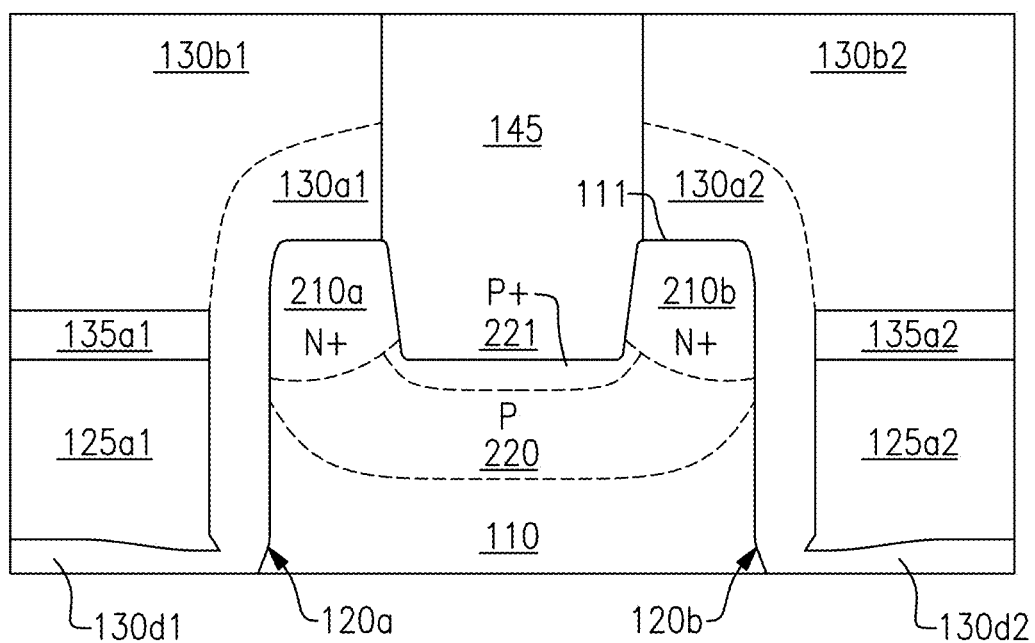
FIG. 1B is an expanded view of a portion of the shielded-gate trench power MOSFET of FIG. 1A.

FIG. 1A is a cross-section of a shielded-gate trench power MOSFET 100 according to one embodiment. FIG. 1B is an expanded view of a portion 1B of the shielded-gate trench power MOSFET 100 of FIG. 1A.

With reference to FIGS. 1A and 1B, the shielded-gate trench power MOSFET 100 is formed in an n-type semiconductor (N) layer 110 (for example, an epitaxial layer or epi layer) that is formed on an N+ substrate 115 that serves as a drain terminal (also referred to as a drain electrode). The shielded-gate trench power MOSFET 100 further includes a first trench 120*a* and a second trench 120*b* formed in the N layer 110. Additionally, a gate oxide layer is formed in the trenches 120*a*/120*b* to form a first gate oxide region 130*a*1 in the first trench 120*a* and a second gate oxide region 130*a*2 in the second trench 120*b*. The trenches 120*a*/120*b* can also include a shield oxide layer 130*c*1/130*c*2 deposited at a bottom of each trench, which can be any suitable thickness. Although an example with two trenches is shown, those skilled in the art will appreciate that certain embodiments of the MOSFET 100 can include a third trench or more (for example, four or more trenches) within the N layer 110.

In the illustrated embodiment, a first shielded gate 125*b*1 is formed near the bottom of the first trench 120*a*, separated from the N layer 110 by the shield oxide layer 130*c*1 and first gate oxide region 130*a*1. Additionally, a first top gate 125*a*1 is formed over the first shielded gate 125*b*1 (separated from the gate by a first intermediate dielectric 130*d*1), and a first silicide region 135*a*l is formed on top of the first top gate 125*a*1. A first upper oxide layer 130*b*1 is formed over the first silicide region 135*a*1. A second shielded gate 125*b*2, a second intermediate dielectric 130*d*2, a second top gate 125*a*2, a second silicide region 135*a*2, and second upper oxide layer 130*b*2 are similarly formed in the second trench 120*b*.

With continuing reference to FIGS. 1A and 1B, the shielded-gate trench power MOSFET 100 further includes P-type semiconductor (P) wells that serve as the MOSFET's body, P+ well contact regions for contacting the P wells, and N+ source regions that serve as the power MOSFET's source regions. Contacts are used to contact the semiconductor body and source regions to reach/electrically connect to a metal layer 140 that serves as the source terminal of the power MOSFET 100 (also referred to herein as a source electrode).

For example, as shown in FIG. 1B, a P well 220 is formed in the N layer 110, and a P+ well contact 221 is formed in the P well 220 and is electrically connected (for example, Ohmic contact) to a metal contact 145. Additionally, a first N+ source region 210*a* is formed between a side of the first trench 120*a* and a first side of the contact 145, while a second N+ source region 210*b* is formed between a side of the second trench 120*b* and a second side of the contact 145. The first N+ source region 210*a* and the second N+ source region 210*b* are electrically connected (for example, Ohmic contact) to the metal contact 145, which in turn connects to the metal layer 140 that serves as the MOSFET's source terminal.

As shown in FIGS. 1A and 1B, the silicide regions 135*a*1/135*b*2 are recessed into the trenches 120*a*/120*b* and self-aligned to the trench gate oxide regions 130*a*1/130*a*2. Accordingly, in the illustrated embodiment, a top of the silicide is below a top 111 of the N layer 110 and trenches 120*a*/120*b*.

With reference to FIGS. 1A and 1B, the trench gate oxide regions 130*a*1/130*a*2 are a high quality dielectric, providing great separation between the source (for example, N+ regions 210*a*/210*b*), the body regions (for example, P well 220), and the gate (for example, gate regions 125*a*1/125*a*2). The shield oxide layers 130*c*1/130*c*2 and/or intermediate dielectrics 130*d*1/130*d*2 can be of the same or a similar insulating material.

In certain embodiments herein, a doped implant for the source region is inserted before the silicide, thus allowing lower-temperature, high-quality silicide to be formed. Thermal processing steps requiring relatively higher temperatures (such as, contact annealing or rapid thermal annealing at over 800° C.) may be performed prior to application of the silicide to avoid degradation due to excess temperatures.

Once the silicide is deposited, thermal processing steps can be limited to protect the quality of the silicide. In a first example, contact annealing for P+ implants (such as a P+ well contact 221) is greatly reduced to 650° C. or less to ensure high quality silicide. In a second example, instead of common high-temperature BPSG for inter-dielectric layers (for example, for backend processing), low-temperature plasma-enhanced chemical vapor deposition (PECVD) or high-density plasma (HDP) oxides are used post silicide formation.

Moreover, integration ensures that a maximum vertical depth of each silicide region 135a1/135a2 does not exceed the vertical depth of a source/body junction, where the N+ source regions 210a/210b interface with the P well 220. This can prevent adverse effects on threshold voltage ($V_T$) and gate oxide quality of the MOSFET 100.

The silicide regions 135a1/135a2 can be formed using various types of silicide, including, but not limited to, a cobalt silicide (for example, $CoSi_2$) for helping to provide fine pitch. In another example, a titanium silicide (for example, $TiSi_2$) is used.

As persons of ordinary skill in the art will appreciate, the P+ doped regions (such as the P+ well contact 221) have a higher doping concentration than the P regions (such as the P well 220). Additionally, N+ regions (such as the N+ substrate 115) have a higher doping concentration than N regions (such as the N-layer 110). Persons having ordinary skill in the art will appreciate various concentrations of dopants will exist in the doped regions.

It should be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries as shown in the figures of this type and are illustrated as abrupt structures merely for the assistance of the reader. As persons having ordinary skill in the art will appreciate, P-type regions can include a P-type semiconductor material, such as boron or gallium, as a dopant. Furthermore, N-type regions can include an N-type semiconductor material, such as phosphorous or arsenic, as a dopant.

Figure 2:
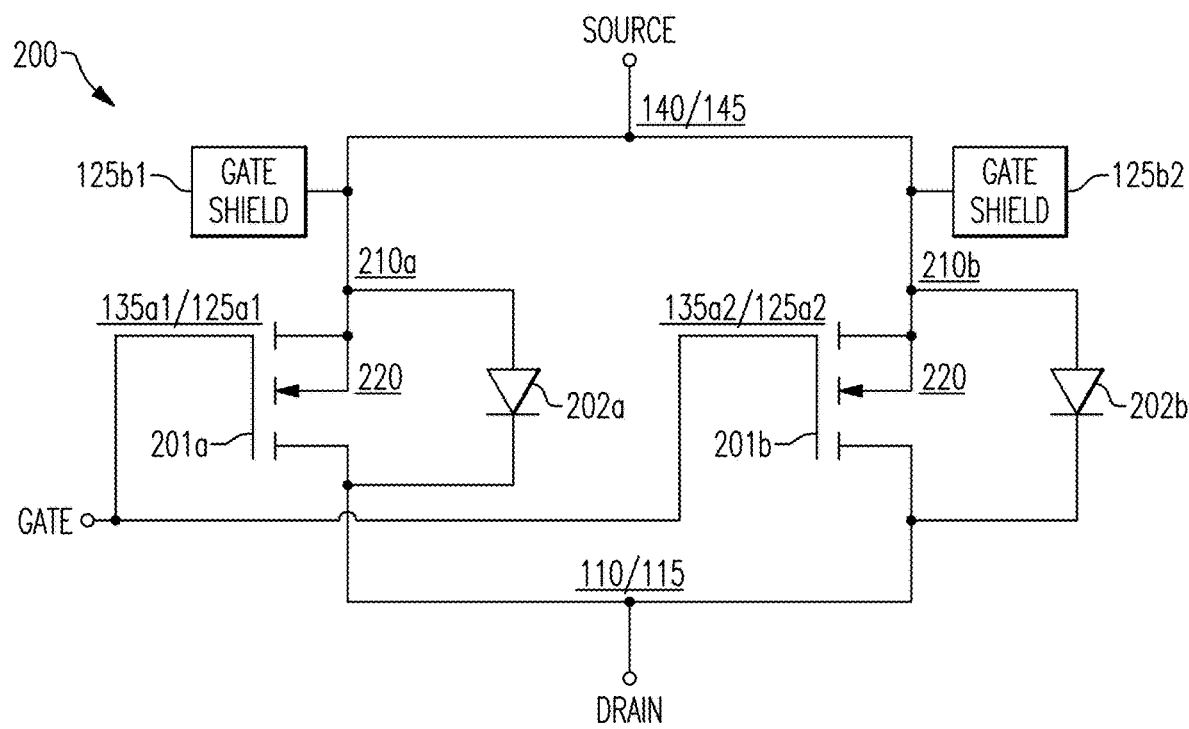
FIG. 2 is an annotated circuit diagram of a portion of the shielded-gate trench power MOSFET of FIGS. 1A and 1B.

FIG. 2 is an annotated circuit diagram 200 of a portion of the shielded-gate trench power MOSFET 100 of FIGS. 1A and 1B. The circuit diagram 200 includes a first n-type power MOSFET 201a, a second n-type power MOSFET 201b a first diode 202a, and a second diode 202b.

Although circuit components corresponding to two power MOSFET components are depicted, the number of circuit components can be scaled by implementing a shielded-gate trench MOSFET to include additional trenches. In particular, the layout of a shielded-gate trench power MOSFET can be replicated to achieve a desired overall device width and power handling capability.

As shown in FIG. 2, a gate terminal (GATE) of the shielded-gate trench MOSFET power 100 is connected to a gate of the first n-type power MOSFET 201a and to a gate of the second n-type power MOSFET 201b. Additionally, a drain terminal (DRAIN) of the shielded-gate trench MOSFET power 100 is connected to a drain of the first n-type power MOSFET 201a, to a drain of the second n-type power MOSFET 201b, to a cathode of the first diode 202a, and to a cathode of the second diode 202b. Additionally, a source terminal (SOURCE) of the shielded-gate trench MOSFET power 100 is connected to a source and a body of the first n-type power MOSFET 201a, to a source and a body of the second n-type power MOSFET 201b, to an anode of the first diode 202a, and to an anode of the second diode 202b.

Various annotations have been depicted showing the correspondence between nodes of the circuit diagram 200 and the shielded-gate trench power MOSFET 100 of FIGS. 1A and 1B. In the illustrated embodiment, the shielded gates 125b1/125b2 are connected to the source terminal (SOURCE) via back-end metallization.

Figure 3:
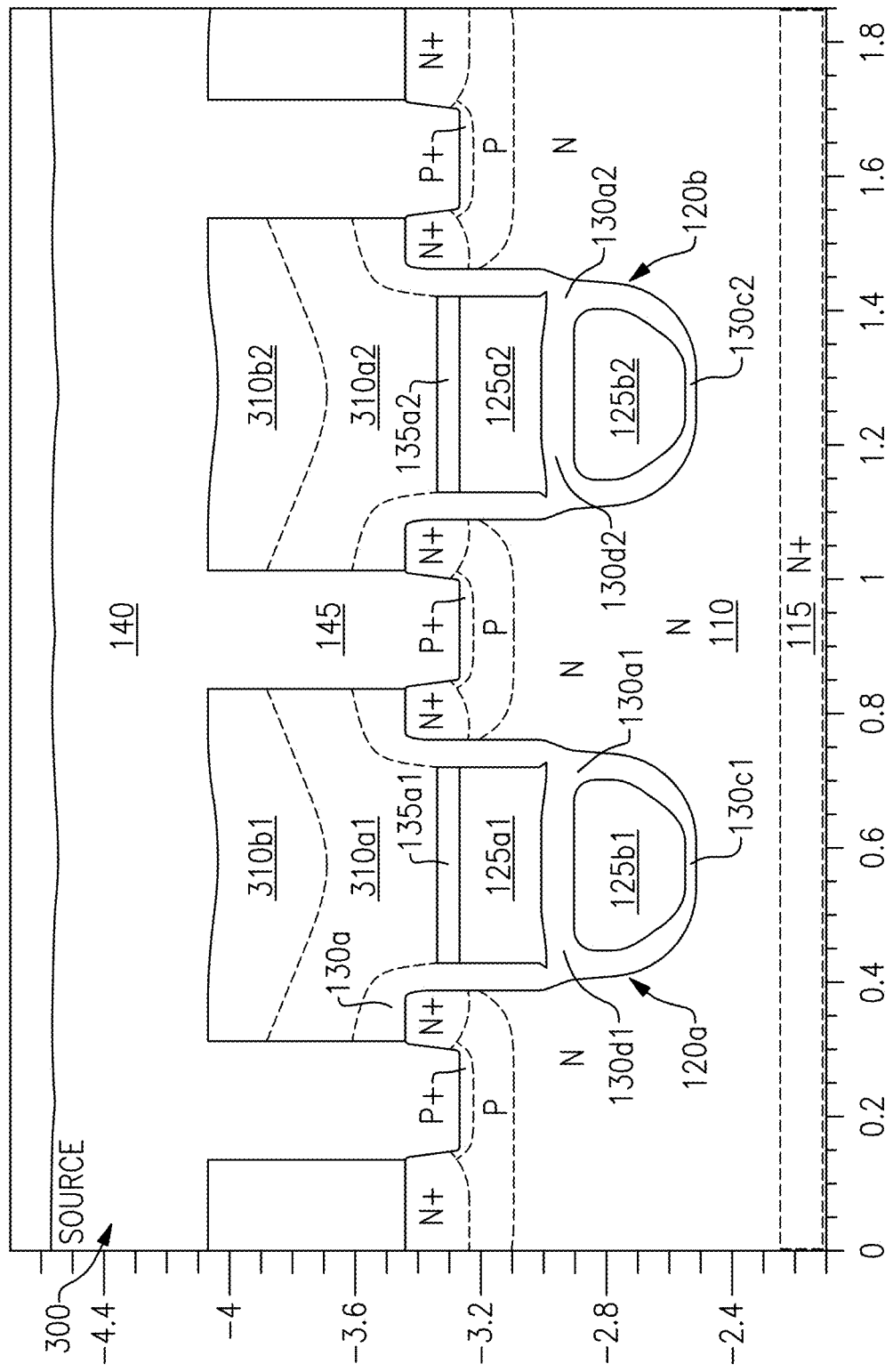
FIG. 3 is a cross-section of a shielded-gate trench power MOSFET having multiple low-temperature gate oxide layers according to another embodiment.

FIG. 3 is a cross-section of a shielded-gate trench power MOSFET 300 having multiple low-temperature gate oxide layers according to another embodiment. Compared to the MOSFET 100 of FIGS. 1A and 1B, the multi-layered shielded-gate trench power MOSFET 300 can include two or more discrete oxide layers present above the silicide regions 135a1/135a2, particularly oxides selected for lower deposition temperature compared to conventional borophosphosilicate glass (BPSG).

In the embodiment of FIG. 3, the MOSFET 300 includes a pair of primary upper oxide layers 310a1/310a2, each primary upper oxide layer directly above and contacting one of the silicide regions 135a1/135a2. The primary upper oxide layer 310a1/310a2 is preferably applied by plasma-enhanced chemical vapor deposition (PECVD) at no more than 650° C. A secondary upper oxide layer 310b1/310b2 is applied over each of the corresponding primary upper oxide layers 310a1/310a2, and can be in contact with one or more lower surfaces of the metal layer 140. (In certain embodiments, a tertiary upper oxide layer or more may be present above the secondary upper oxide layer 310b1/310b2, comprising additional insulating materials applied by any of the methods disclosed herein.) Preferably, the secondary upper oxide layer 310b1/310b2 is a high-density-plasma chemical vapor deposition (HDP-CVD) oxide.

The primary upper oxide layer 310a1/310a2 and secondary upper oxide layer 310b1/310b2 can each be deposited after application of the silicide regions 135a1/135a2, with thermal processing steps limited in temperature to preserve the silicide. For ease of manufacture, oxide layers of the same material may be deposited in multiple iterations (sub-layers), such as to maintain a temperature of the MOSFET 300 below approximately 650° C. Depending on the specific type of silicide used in the silicide regions 135a1/135a2, a maximum temperature threshold for the thermal processing steps may be selected at less than 650° C.

Figure 4:
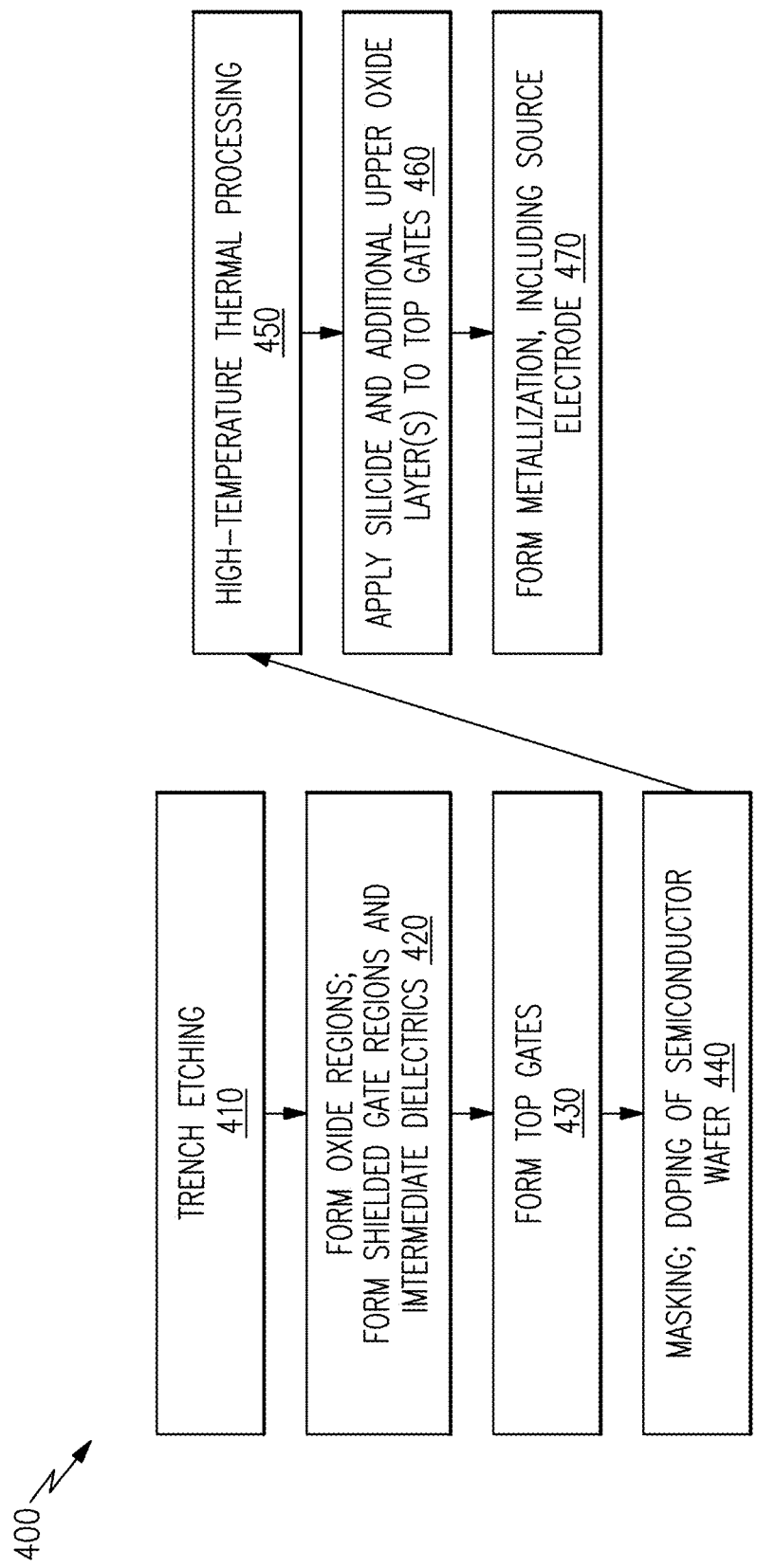
FIG. 4 illustrates one embodiment of a method of fabricating a shielded-gate trench power MOSFET.

FIG. 4 illustrates one embodiment of a method 400 of fabricating a shielded-gate trench power MOSFET 100. It will be appreciated by those skilled in the art that the steps of the method 400 do not necessarily need to occur in the illustrated sequence.

A semiconductor wafer is provided in a first step 410. In certain embodiments, the semiconductor wafer is provided with the n-type semiconductor (N) layer 110 (such as, an epitaxial layer) formed on a portion of an N+ substrate 115 that acts as the drain electrode of the MOSFET 100.

In the first step 410, the first trench 120a and the second trench 120b are formed in a planar upper surface of the semiconductor wafer. The trenches 120a/120b are preferably formed by dry etching, such as trench etching, though other techniques known to one skilled in the art may be applied. Forming the trenches can include masking the semiconductor wafer prior to etching in order to more precisely control the dimensions of each trench. In certain embodiments, each trench 120a/120b can have a vertical depth great than a horizontal width. For example, in one implementation, the trenches each have a vertical depth extending below the upper surface of the semiconductor wafer by at least 1 micrometer, and a horizontal width of less than approximately 0.3 micrometers. The etching process defines a pair of walls and a bottom for each trench 120a/120b, with at least an upper portion of the walls being substantially vertical. In certain embodiments, such as in FIGS. 1A and 1B, a lower portion of each wall may be rounded off to form a gradual transition to the bottom of the trench. For example, providing a gradual transition can improve consistency and longevity of the MOSFET 100 by avoiding an accumulation of material at the bottom of the trenches. The rounded trenches can also alleviate high electrical field stress caused by sharp trench corners, which could otherwise contribute to low breakdowns, weak breakdowns, and poor reliability of the MOSFET 100.

In a second step 420, the bottom of each trench 120a/120b is lined with oxide to form the shield oxide layers 130c1/130c2. Additionally, a shielded (bottom) gate region 125b1/125b2 is formed within each trench 120a/120b such that the gate region abuts the corresponding shield oxide layer 130c1/130c2 directly above the bottom of the trench. In preparation to receive the top gate 125a1/125a2 over the shielded gate, the intermediate dielectric layer 130d1/130d2 is applied over the shielded gate regions 125b1/125b2 to bury the bottom gate regions within each trench 120a/120b. Although referred to as a singular layer, the intermediate dielectric layer 130d1/130d2 within each trench can comprise multiple discrete oxide sub-layers.

After formation of the intermediate dielectric layer 130d1/130d2, the walls of each trench 120a/120b are lined with an oxide to form the gate oxide regions 130a1/130a2 on the walls of the trench. The gate oxide regions 130a1/130a2 and shield oxide layers 130c1/130c2 provide an insulating layer between the semiconductor wafer and an interior of each trench. The gate oxide regions 130a1/130a2 and shield oxide layers 130c1/130c2 are a high-quality SiO2 or other oxide, and may be of a different type of oxide than the first and second upper oxide layers 130b1/130b2 or the primary and secondary upper oxide layers 310a/310b in the embodiment of FIG. 3. In certain embodiments, the gate oxide regions 130a1/130a2, the shield oxide layers 130c1/130c2, and the intermediate dielectric layers 130d1/130d2 can be of the same or similar oxides, or another insulator known to one skilled in the art.

The architecture of the shielded gate regions 125b1/125b2 is at least partially determined by the physical size and depth of the trenches 120a/120b. Proximity of the gate regions to the semiconductor wafer (and selection of oxide) can significantly affect gate capacitance, transconductance, and threshold voltage ($V_T$) of the MOSFET 100. As discussed above, the lower portion of the trench walls may rounded off, requiring the shielded gate regions 125b1/125b2 to have a complementary curvature to fit closely to the bottom of the trench.

In a third step 430, a top gate 125a1/125a2 is formed within each trench 120a/120b such that each of the intermediate dielectrics 130d1/130d2 are sandwiched between the corresponding top gate 125a1/125a2 and shielded gate 125b1/125b2. The top gate 125a1/125a2 is formed within the trench 120a/120b such that only an upper surface remains exposed, while a periphery of the top gate 125a1/125a2 is substantially enveloped by the gate oxide region 130a1/130a2.

The top gate 125a1/125a2 preferably has a planar upper surface for depositing a layer of silicide. As will be discussed herein, the upper surface of each of the top gates 125a1/125a2 is recessed within the trench 120a/120b for improved performance of the MOSFET 100 once the silicide is deposited.

In a fourth step 440, doping is performed (such as by ion implantation over the whole MOSFET 100) to form one or more doped regions within the semiconductor wafer. Doping can define the several doped regions described above with reference to FIGS. 1A and 1B, such as the first and second N+ source regions 210a/210b and the P+ well contact 221.

Additional doped regions may be formed in the semiconductor wafer aside from those specifically identified in FIGS. 1A and 1B. In certain embodiments, the doped regions may not be contiguous within the semiconductor wafer, or may not form discrete physical boundaries between different regions. Doping can also be performed in multiple discrete steps, and is not necessarily limited to the fourth step 440. In certain embodiments, for ease of manufacture, certain regions of the semiconductor die may be doped prior to formation of the first trench 120a and second trench 120b or another structure within the die. Additional features of the wafer can be masked prior to doping, such as termination and die edges.

In a fifth step 450, the doped semiconductor wafer can undergo high-temperature thermal processing. Techniques for thermal processing can include rapid thermal annealing or the like. Those skilled in the art will appreciate that thermal processing is most effective for diffusion of certain dopant ions, such as phosphorus or arsenic, at temperatures upward of 800° C. Therefore, high-temperature thermal processing can occur in the fifth step 450, prior to depositing a silicide layer, which is particularly sensitive to high temperatures and can be degraded or destroyed. This allows later thermal processing of the MOSFET 100 to be maintained below 800° C., or even below 650° C., in order to preserve the silicide.

In a sixth step 460, a self-aligned silicide layer is applied to the upper surface of each top gate 125a1/125a2 to form the first and second silicide regions 135a1/135a2. Because the upper surface of each of the top gates 125a1/125a2 is recessed within the trench 120a/120b, in certain embodiments a maximum vertical depth of each silicide region 135a1/135a2 does not exceed the vertical depth of the source/body junction to avoid adversely affecting the threshold voltage ($V_T$) of the MOSFET 100. The silicide layer may be applied in multiple portions or layers, but each silicide region 135a1/135a2 is relatively thin to remain recessed within the respective trench. In certain embodiments, each silicide region 135a1/135a2 is no more than approximately 0.1 micrometers thick.

Advantageously, by lining the walls of the trenches 120a/120b with the gate oxide regions 130a1/130a2, only the upper surface of each top gate 125a1/125a2 is exposed prior to applying the silicide layer. The resulting silicide regions 135a1/135a2 are self-aligned with a perimeter edge of the corresponding top gate, efficiently shaping the silicide within the desired boundary. Once the silicide regions 135a1/135a2 are formed, one or more additional upper oxide layers 130b1/130b2 can be deposited over each trench 120a/120b to seal in the silicide. In certain embodiments, the additional oxide layers can be the primary and secondary oxide layers 310a/310b as discussed above with reference to FIG. 3.

In a seventh step 470, metallization is formed over the semiconductor wafer to provide a metal layer 140 (also referred to as a metal backend) in electrical contact with the source region of the MOSFET 100. The metal backend 140 can be formed by evaporation, sputtering, or any other technique known to one skilled in the art. Chemical mechanical planarization (CMP), combined with contact etching, may be used to create a plurality of recesses within the semiconductor wafer, and a tungsten plug (W plug) can be formed within a contact opening at the top surface of the semiconductor wafer to provide the wafer with a planar upper surface.

The metal backend 140 can be a pure metal (for example, aluminum, copper, tungsten, palladium, platinum, iridium, or rhodium), or an alloy comprising two or more types of metal, such as AlCu. In certain embodiments, prior to metallization, the P+ well contact 221 is formed in the P well 220, such as by ion implantation.

Throughout the process of FIG. 4, and particularly after forming the silicide regions 135a1/135a2, thermal processing temperatures of the semiconductor wafer can be limited to approximately 650° C. Thermal processing techniques can include rapid thermal annealing (RTA), contact annealing applied to the P+ well contact 221, or similar methods configured to avoid damage to the silicide by excess thermal processing.

The size of each semiconductor component can vary depending on the application, and each component can host a plurality of MOSFETs 100 constructed according to the present disclosure. Such cutting or dicing of the wafer into individual components occurs in some implementations after the seventh step 470.

Referring now to FIGS. 5A-5E, another embodiment of a method 500 of fabricating a shielded-gate trench power MOSFET 100 is illustrated. It will be understood by those skilled in the art that the steps described above with reference to FIG. 4 can generally correspond to aspects of the embodiment of FIGS. 5A-5E.

FIG. 5A is a first cross-section in the method 500. FIG. 5A illustrates wherein the semiconductor die comprises one or more epitaxial layers 110 above the N+ substrate 115. In certain embodiments, two or more epitaxial layers 110 can be provided to enhance an electric field toward the bottom of each trench 120a/120b, which can improve robustness of the MOSFET 100 by providing a higher breakdown voltage.

FIG. 5B is a second cross-section in the method 500. FIG. 5B illustrates the formation of one of the trenches 120a/120b in the upper surface of the semiconductor wafer, the trench extending through the epitaxial layer(s) 110. In the preferred embodiment, each of the trenches 120a/120b can extend at least 1 micrometer below the surface of the die, but does not reach the depth of the N+ substrate 115.

As before, etching can define the walls and bottom of each trench 120a/120b, the bottom of which are lined with an oxide layer to form the shield oxide layers 130c1/130c2. The shielded gates 125b1/125b2 are thereafter formed within each trench, followed by the intermediate dielectric 130d1/130d2, and thereafter followed by the gate oxide regions 130a1/130a2. Then, the top gate 125a1/125a2 is formed above the dielectric. (For ease of illustration, in FIG. 5B the intermediate dielectric 130d is shown as a contiguous portion of the gate oxide region 130a, although the dielectric is formed separately after the shielded gates 125b1/125b2.) Each top gate 125a1/125a2 is formed within the corresponding trench 120a/120b such that only the upper surface of the top gate remains uncovered by the gate oxide regions 130a1/130a2 lining the trench walls. The upper surface of the top gate 125a1/125a2 is recessed below an upper surface of the top epitaxial layer 110a, allowing the silicide to be self-aligned with the top gate 125a1/125a2 in a later step.

Figure 5D:
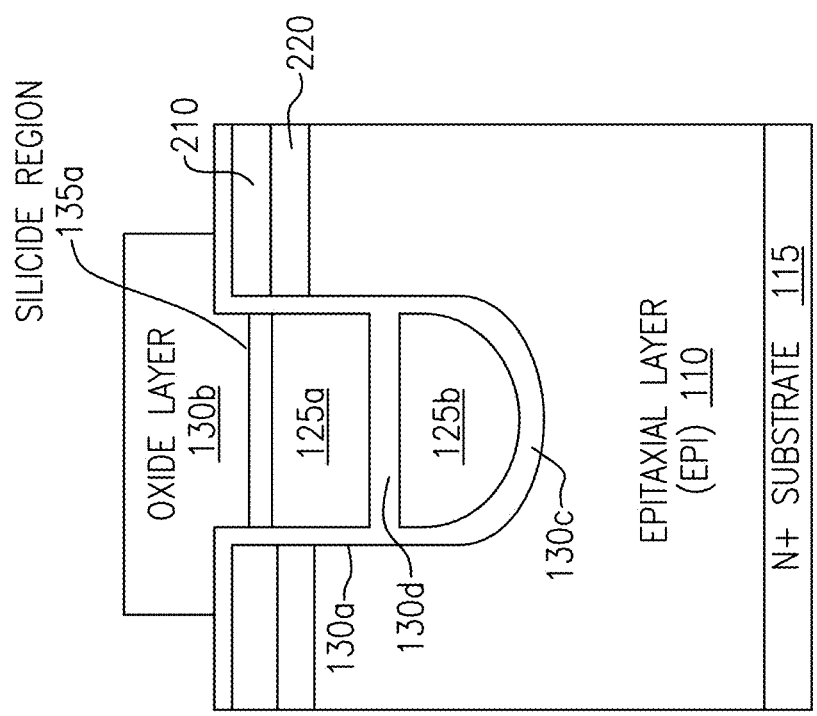
FIG. 5D is a fourth cross-section in a method of fabricating a shielded-gate trench power MOSFET according to another embodiment.
Figure 5C:
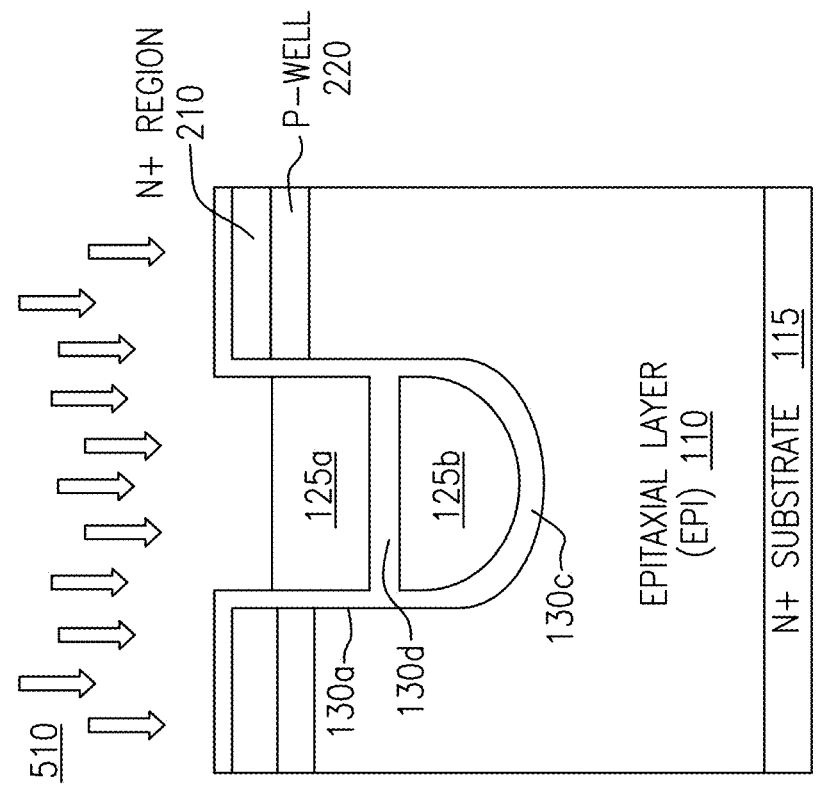
FIG. 5C is a third cross-section in a method of fabricating a shielded-gate trench power MOSFET according to another embodiment.

FIG. 5C is a third cross-section in the method 500. FIG. 5C illustrates doping 510 of the semiconductor wafer to form the doped regions (including the N+ source regions 210a/210b and the P well 220) in the epitaxial layer 110. For a die containing multiple epitaxial layers, the doped regions are formed in the uppermost layer. Doping is preferably performed by ion implantation 510, and can include masking a periphery of the MOSFET 100 (such as, termination and die edges) from the ions. As described above, doping and high-temperature thermal processing (including annealing of the semiconductor wafer) is performed before formation of the silicide regions 135a1/135a2 to allow for higher temperature thermal processing without risking damage to the silicide.

FIG. 5D is a fourth cross-section in the method 500. FIG. 5D illustrates formation of the silicide region 135a/135b by applying a silicide layer over the upper surface of the corresponding top gate 125a1/125a2. Because the top gate 125a1/125a2 is recessed below an upper surface of the top epitaxial layer 110a, the silicide region 135a/135b is self-aligned to a perimeter of the upper surface bounded by the gate oxide region 130a1/130a2. Once the silicide layer is applied, the gate oxide layer is patterned and the upper oxide layer 130b is applied over the trench 120a/120b to completely enclose the silicide and trench.

Figure 5E:
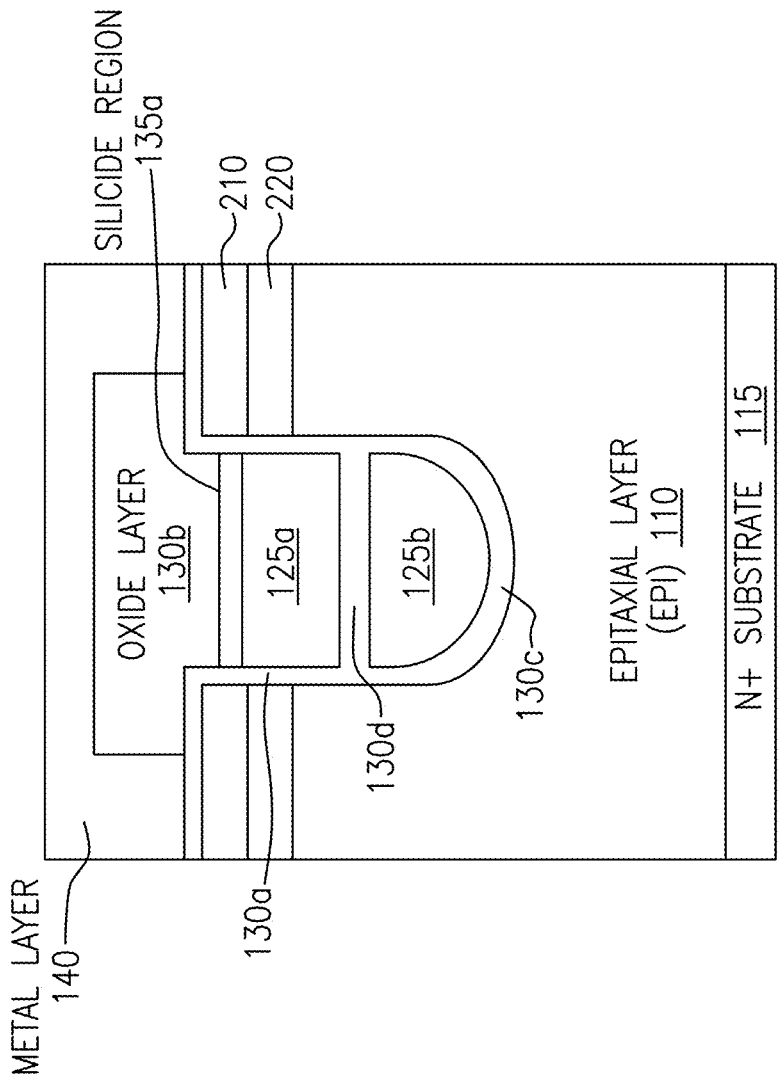
FIG. 5E is a fifth cross-section in a method of fabricating a shielded-gate trench power MOSFET according to another embodiment.

FIG. 5E is a fifth cross-section in the method 500. FIG. 5E illustrates forming metallization to deposit the metal backend 140 over the semiconductor wafer to form an electrical connection to the source regions 210a/210b of the MOSFET 100. In certain embodiments, pads of the metal backend 140 are coupled to P+ well contacts 221 above the source region, providing an electrical connection from the metal layer to the source/body junction.

Figure 6A:
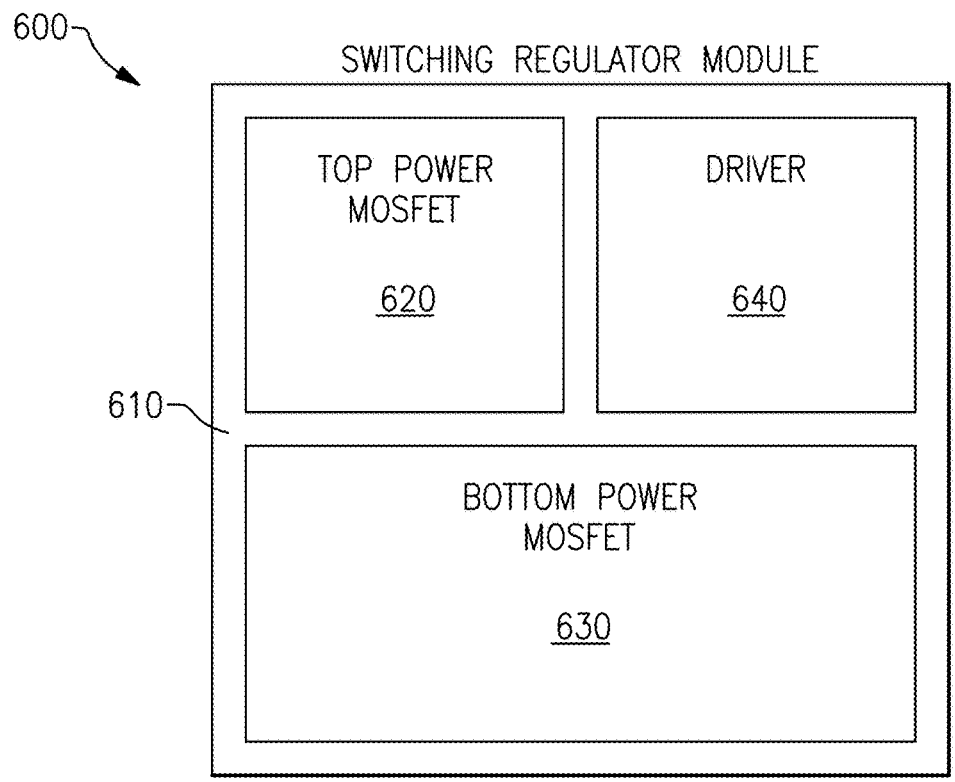
FIG. 6A is a schematic diagram of one embodiment of a trilithic switching regulator module according to one embodiment.
Figure 6B:
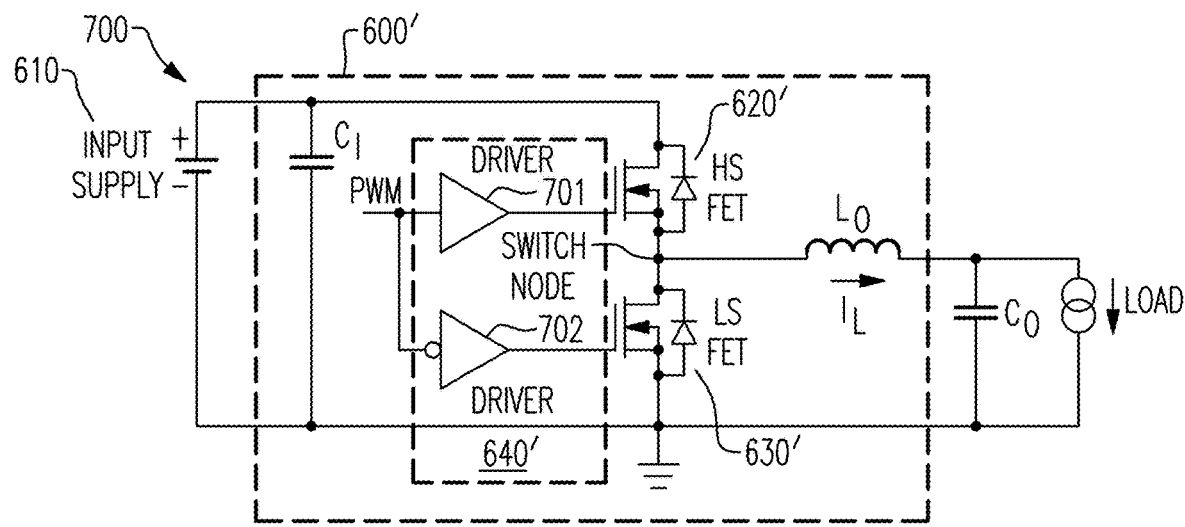
FIG. 6B is a circuit diagram of the trilithic switching regulator module of FIG. 6A.

Referring now to FIGS. 6A to 6B, the shielded-gate trench power MOSFET can be used in a variety of applications, including as voltage regulators in power electronics.

A voltage regulator serves to generate a substantially constant output voltage from a poorly-specified and/or fluctuating supply voltage or other input voltage source. Series regulators and switching regulators are two common types of voltage regulators. Low dropout (LDO) series regulators provide good regulation with very low noise, however, the current supply from the regulated output comes directly from the supply voltage. Thus, an LDO series regulator's efficiency is limited by the ratio of the output voltage to the supply voltage, and thus the efficiency of the LDO series regulator drops rapidly as the supply voltage increases relative to the output voltage. Switching regulators are generally more efficient than series regulators. A switching regulator employs one or more power transistors coupled in series and/or parallel with an output terminal that provides an output voltage to a load. Additionally, a controller turns the switches ON and OFF to control delivery of current pulses to the output terminal. One or more energy storage elements, such as inductor(s) and/or capacitor(s), can be used to convert the switched current pulses into a steady load current.

FIG. 6A is a schematic diagram of a trilithic switching regulator module 600 according to one embodiment. The trilithic switching regulator module 600 includes a module substrate 610 on which a top power MOSFET 620 (also referred to as a high side power MOSFET), a bottom power MOSFET 630 (also referred to as a low side power MOSFET), and a driver integrated circuit (IC) 640 are attached.

The top power MOSFET 620 and/or the bottom power MOSFET 630 can be implemented in accordance with any of the embodiments herein.

In certain implementations, the top power MOSFET 620 and the bottom power MOSFET 630 are connected in series as a half bridge. Such half bride circuits can be used in a wide variety of switching regulator topologies, such as buck converters, boost converters, and buck-boost converters. The driver IC 640 generates driver control signals for the gates of the top power MOSFET 620 and the bottom power MOSFET 630. In certain implementations, the driver IC 640 further includes an integrated pulse width modulator (PWM) controller, and thus can include both driver and control functionalities.

FIG. 6B is a circuit diagram 700 of one embodiment of the trilithic switching regulator module 600 of FIG. 6A.

The circuit diagram 700 depicts an implementation of a trilithic switching regulator module 600' including a top power MOSFET 620', a bottom power MOSFET 630', a driver IC 640', an input capacitor Ci, an output inductor Lo. The depicted components of the trilithic switching regulator module 600' can be attached to a module substrate. In one example, the top power MOSFET 620' and the bottom power MOSFET 630' correspond to discrete power transistors, the driver IC 640' corresponds to a semiconductor die, and the input capacitor Ci and the output inductor Lo correspond to surface mount devices (SMDs) attached to the module substrate.

In the illustrated embodiment, trilithic switching regulator module 600' receives power from an input supply, and drives a load (represented as an output capacitor Co and a load current source). The input capacitor Ci is connected in parallel with the input supply. Additionally, a drain of the top power MOSFET 620' is connected to a positive terminal of the input supply, and a source/body of the top power MOSFET 620' is connected to a first terminal of the output inductor Lo at a switch node. Additionally, a drain of the bottom power MOSFET 630' is connected to the first terminal of the output inductor Lo, while a source/body of the bottom power MOSFET 630' is connected to a negative terminal of the input supply. A second terminal of the output inductor Lo drives the load.

As shown in FIG. 7, the driver IC 640' includes a top or high side driver 701 and a bottom or low side driver 702 each of which are controlled by a PWM control signal. The high side driver 701 drives a gate of the top power MOSFET 620', while the low side driver 702 drives a gate of the bottom power MOSFET 630'. The drivers 701/702 output gate drive control signals with complementary polarity.

The circuit diagram 700 illustrates one embodiment of an application for the shielded-gate trench power MOSFETs herein. For example, the top power MOSFET 620' and/or the bottom power MOSFET 630' can be implemented in accordance with any of the embodiments herein. Although the circuit diagram 700 depicts an example application of shielded-gate trench power MOSFETs, the teachings herein are applicable to a wide variety of applications. Accordingly, the shielded-gate trench power MOSFETs herein can be used in other implementations of circuits, including, but not limited to, other types of switching regulators.

By implementing the power MOSFETs with gate silicide in accordance with the present disclosure, gate drive becomes much more efficient with low gate resistance (Rg). For example, a gate time constant can be based on a product of gate resistance and gate capacitance. By reducing gate resistance, the gate time constant is decreased, which leads to higher switching frequency and/or smaller form factor.

Moreover, efficient gate driving leads to reduced dead time and/or reduced reverse recover in the regulator, which leads to higher regulator efficiency.

Furthermore, for a given gate threshold voltage (Vgs), smaller gate resistance enable increased voltage drive (dV/dt) capability. This in turn leads to improved transient power loss, higher frequency, smaller form factor, and/or higher efficiency.

Applications

Devices employing the above described schemes can be implemented into various electronic devices in a wide range of applications including, but not limited to, bus converters, high current distributed power systems, telecom systems, datacom systems, storage systems, automotive systems, and power conversion systems. Thus, examples of electronic devices that can be implemented with the shielded-gate trench power MOSFETs herein include, but are not limited to, communication systems, consumer electronic products, electronic test equipment, communication infrastructure, servers, automobiles, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A method of fabricating a shielded-gate metal-oxide-semiconductor field-effect transistor, comprising:
   etching a gate trench in a top surface of a semiconductor layer of a first doping polarity;
   forming a semiconductor well in the semiconductor layer and of a second doping polarity opposite the first doping polarity;
   forming a source region in the semiconductor well and of the first doping polarity;
   contacting the semiconductor well and the source region using a metal contact;
   forming in the gate trench a gate shield and a gate region each recessed below the top surface of the semiconductor layer and electrically insulated from the semiconductor layer by a gate oxide, wherein the gate region is formed over the gate shield in the gate trench and electrically insulated from the gate shield;

forming a silicide region over the gate region, the silicide region being aligned to the gate region by the gate oxide;

rapid thermal annealing only at a temperature below 800 degrees Celsius after forming the silicide region; and besides the rapid thermal annealing, performing thermal processing after forming the silicide region at a temperature of no more than about 650 degrees Celsius to preserve the silicide region.

2. The method of claim 1, further comprising applying an intermediate dielectric layer over the gate shield to electrically insulate the gate shield from the gate region.

3. The method of claim 2, wherein the dielectric layer comprises an oxide.

4. The method of claim 1, wherein the rapid thermal annealing is performed for no more than about 10 seconds.

5. The method of claim 1, further comprising forming the silicide region with a maximum vertical depth that does not exceed a maximum vertical depth of a junction of the source region and the semiconductor well.

6. The method of claim 5, wherein the first doping polarity is n-type and the second doping polarity is p-type.

7. The method of claim 1, further comprising forming a primary upper oxide layer over the silicide region by using plasma-enhanced chemical vapor deposition at no more than 650° C.

8. The method of claim 7, further comprising forming a secondary upper oxide layer over the primary upper oxide layer using high-density-plasma chemical vapor deposition at no more than 650° C.

9. The method of claim 7, wherein the primary upper oxide layer is formed as sub-layers in multiple iterations to maintain a temperature below 650° C.

10. The method of claim 1, further comprising performing backend processing over the silicide region at a temperature of no more than 650° C.

11. The method of claim 1, wherein the silicide region is recessed within the gate trench below the top surface of the semiconductor layer.

12. The method of claim 1, further comprising forming a metal layer over the semiconductor layer, the metal layer including a source electrode electrically connected to the metal contact.

13. The method of claim 12, further comprising forming a drain electrode connected to a bottom surface of the semiconductor layer.

14. The method of claim 12, wherein the gate shield is electrically connected to the source electrode.

15. The method of claim 1, further comprising forming the gate oxide as a thermal oxide.

16. The method of claim 1, further comprising forming the gate oxide using a high-density plasma (HDP).

17. The method of claim 1, wherein the gate trench has a depth of at least 1 micrometer relative to the top surface of the semiconductor layer.

18. The method of claim 1, wherein the silicide region comprises a cobalt silicide.

19. The method of claim 1, wherein the silicide region comprises a titanium silicide.

20. The method of claim 1, wherein the first doping polarity is n-type, and the second doping polarity is p-type.

* * * * *